United States Patent
Suzuki

(10) Patent No.: US 10,090,686 B2
(45) Date of Patent: *Oct. 2, 2018

(54) ELECTRICAL STORAGE SYSTEM

(71) Applicant: TOYOTA JIDOSHA KABUSHIKI KAISHA, Toyota-shi, Aichi-ken (JP)

(72) Inventor: Yusuke Suzuki, Nagakute (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/100,083

(22) PCT Filed: Dec. 2, 2014

(86) PCT No.: PCT/IB2014/002616
§ 371 (c)(1),
(2) Date: May 27, 2016

(87) PCT Pub. No.: WO2015/082972
PCT Pub. Date: Jun. 11, 2015

(65) Prior Publication Data
US 2017/0005488 A1 Jan. 5, 2017

(30) Foreign Application Priority Data

Dec. 6, 2013 (JP) ................................. 2013-253688

(51) Int. Cl.
*H02J 7/00* (2006.01)
*H02J 7/14* (2006.01)
(Continued)

(52) U.S. Cl.
CPC ......... *H02J 7/0021* (2013.01); *B60L 11/1803* (2013.01); *B60L 11/1816* (2013.01);
(Continued)

(58) Field of Classification Search
USPC ....... 320/104, 107, 110, 116, 134, 165, 160, 320/105, 101, 103, 112, 117, 124, 128,
(Continued)

(56) References Cited

U.S. PATENT DOCUMENTS

2006/0181245 A1 8/2006 Mizuno et al.
2010/0318252 A1 12/2010 Izumi
(Continued)

FOREIGN PATENT DOCUMENTS

JP 2007292666 A 11/2007
JP 2012-132761 A 7/2012
(Continued)

OTHER PUBLICATIONS

Communication dated Jul. 10, 2018 issued by the U.S. Patent and Trademark Office in U.S. Appl. No. 15/104,402.

*Primary Examiner* — Alexis Pacheco
(74) *Attorney, Agent, or Firm* — Sughrue Mion, PLLC

(57) ABSTRACT

An electrical storage system includes an electrical storage device, a voltage sensor, a current sensor and a controller. The controller calculates a full charge capacity of the electrical storage device on the basis of a state of charge of the electrical storage device at the time when external charging is started, a state of charge of the electrical storage device at the time when the external charging is completed, and an accumulated value of a current value during the period when the external charging is being carried out, and sets a polarization elimination time. When a stopped time during the period when charging or discharging of the electrical storage device is stopped is longer than the polarization elimination time, the controller regards a voltage value of the electrical storage device at the time of at least one of the start of the external charging or the completion of the external charging as an open circuit voltage of the electrical storage device. The controller calculates a state of
(Continued)

charge corresponding to the voltage value as a state of charge that is used to calculate the full charge capacity by using a correlation between the open circuit voltage and the state of charge. The controller shortens the polarization elimination time as a rate of change increases. The rate of change indicates a ratio of a variation in the open circuit voltage to a variation in the state of charge.

7 Claims, 10 Drawing Sheets

(51) Int. Cl.
*B60L 11/18* (2006.01)
*H01M 10/48* (2006.01)
*G01R 31/36* (2006.01)
*H01M 10/44* (2006.01)

(52) U.S. Cl.
CPC ....... *B60L 11/1824* (2013.01); *B60L 11/1861* (2013.01); *B60L 11/1864* (2013.01); *G01R 31/3624* (2013.01); *G01R 31/3651* (2013.01); *G01R 31/3675* (2013.01); *H01M 10/48* (2013.01); *H01M 10/486* (2013.01); *H02J 7/0047* (2013.01); *H02J 7/0057* (2013.01); *B60L 2240/545* (2013.01); *B60L 2240/547* (2013.01); *B60L 2240/549* (2013.01); *B60L 2240/80* (2013.01); *B60L 2260/44* (2013.01); *H01M 10/44* (2013.01); *Y02T 10/7005* (2013.01); *Y02T 10/7044* (2013.01); *Y02T 10/7061* (2013.01); *Y02T 10/7072* (2013.01); *Y02T 90/14* (2013.01)

(58) Field of Classification Search
USPC .......................................... 320/132, 135, 159
See application file for complete search history.

(56) References Cited

U.S. PATENT DOCUMENTS

| 2014/0225621 | A1 | 8/2014 | Kimura et al. |
| 2015/0134283 | A1 | 5/2015 | Ogura |
| 2016/0318417 | A1* | 11/2016 | Suzuki ................ H01M 10/486 |

FOREIGN PATENT DOCUMENTS

| JP | 2013-101072 A | 5/2013 |
| JP | 2013-108919 A | 6/2013 |
| JP | 2013-214371 A | 10/2013 |
| WO | 2009/104305 A1 | 8/2009 |
| WO | 2012/140776 A1 | 10/2012 |
| WO | 2013/054414 A1 | 4/2013 |
| WO | 2013/171786 A1 | 11/2013 |

* cited by examiner

F I G . 9
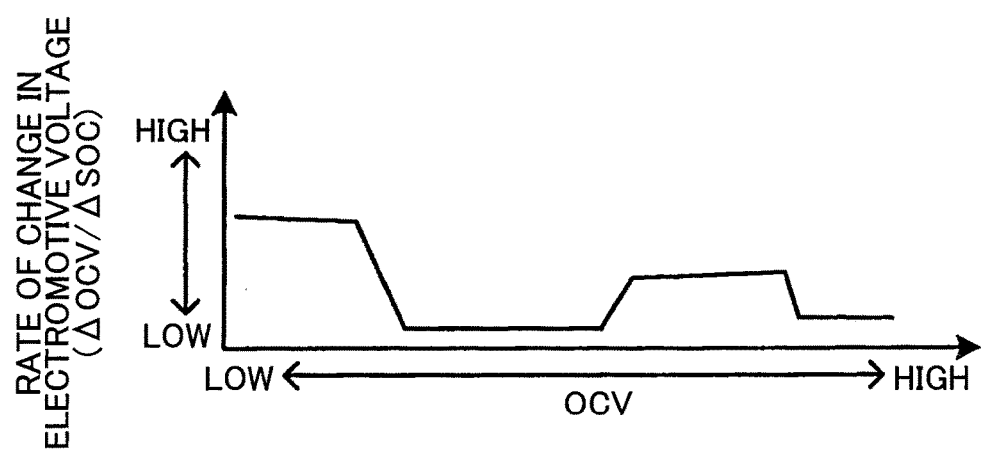

ELECTRICAL STORAGE SYSTEM

BACKGROUND OF THE INVENTION

1. Field of the Invention

The invention relates to an electrical storage system that calculates a full charge capacity of an electrical storage device.

2. Description of Related Art

In Japanese Patent Application Publication No 2013-101072 (JP 2013-101072 A), when a battery pack is charged with electric power from an external power supply (referred to as external charging), a full charge capacity of the battery pack is calculated. The full charge capacity of the battery pack is calculated on the basis of a state of charge (SOC) of the battery pack at the start of external charging, an SOC of the battery pack at the completion of external charging, and an accumulated current value during the period when external charging is being carried out. Because there is a predetermined correlation between an SOC and an open circuit voltage (OCV), the SOC of the battery pack is calculated from the OCV of the battery pack.

SUMMARY OF THE INVENTION

When polarization occurs as a result of charging or discharging of the battery pack, a voltage value of the battery pack, which is detected by a voltage sensor, (referred to as detected voltage value) includes a voltage variation resulting from the polarization. Therefore, the detected voltage value deviates from the OCV by the amount of the voltage variation resulting from the polarization. When charging or discharging of the battery pack is kept stopped, it is possible to eliminate the polarization. Thus, after the polarization has been eliminated, the detected voltage value may be regarded as the OCV.

By acquiring a time during the period when charging or discharging of the battery pack is stopped, it is possible to determine whether the polarization has been eliminated. Specifically, the time during the period when the polarization is eliminated (referred to as polarization elimination time) is set in advance as a fixed value, and, when a time during the period when charging or discharging of the battery pack is stopped is longer than the polarization elimination time, it is determined that the polarization has been eliminated. Polarization changes in response to a history of charging or discharging of the battery pack. Therefore, when the polarization elimination time (fixed value) is set in consideration of possible largest polarization, it is possible to determine that the polarization has been eliminated irrespective of the state of the polarization.

However, if the polarization elimination time (fixed value) is set in consideration of the largest polarization, the polarization elimination time (fixed value) tends to be long. Accordingly, a time required to determine that the polarization has been eliminated also tends to be long, with the result that it becomes difficult to acquire the OCV of the battery pack. Specifically, if charging or discharging of the battery pack is started before a lapse of the polarization elimination time (fixed value), the OCV of the battery pack cannot be acquired. As a result, it is not possible to calculate the SOC of the battery pack from the OCV of the battery pack, so it is not possible to calculate the full charge capacity of the battery pack from the SOC of the battery pack.

An aspect of the invention provides an electrical storage system. The electrical storage system includes an electrical storage device, a voltage sensor, a current sensor and a controller. The electrical storage system is configured to be charged by an external charging. The external charging is to carry out charging with electric power from an external power supply. The voltage sensor is configured to detect a voltage value of the electrical storage device. The current sensor is configured to detect a current value of the electrical storage device. The controller is configured to calculate (estimate) a full charge capacity of the electrical storage device.

The controller is configured to calculate the full charge capacity of the electrical storage device on the basis of a state of charge of the electrical storage device at the time when the external charging is started, a state of charge of the electrical storage device at the time when the external charging is completed, and an accumulated value of the current value during the period when the external charging is being carried out. The controller is configured to regard the voltage value of the electrical storage device, when a stopped time during the period when charging or discharging of the electrical storage device is stopped is longer than a polarization elimination time. The voltage value is detected by the voltage sensor as an open circuit voltage. The controller is configured to calculate the state of charge corresponding to the voltage value detected by the voltage sensor as the state of charge that is used to calculate the full charge capacity by using a correlation between the open circuit voltage and the state of charge. The controller is configured to set a polarization elimination time. The polarization elimination time is used to determine an eliminated state of polarization that occurs as a result of charging or discharging of the electrical storage device, Where a ratio of a variation in the open circuit voltage to a variation in the state of charge is defined as a rate of change, the polarization elimination time depends on the rate of change. The controller is configured to shorten the polarization elimination time as the rate of change increases, when the state of charge is calculated from the voltage value detected by the voltage sensor at the time of at least one of the start of the external charging and the completion of the external charging. Specifically, the rate of change is a value obtained by dividing the variation in the open circuit voltage by the variation in the state of charge.

When the full charge capacity of the electrical storage device is calculated (estimated), it is necessary to ensure the estimation accuracy of the state of charge at the start of the external charging and at the completion of the external charging in order to ensure the estimation accuracy of the full charge capacity. When the state of charge that is calculated (estimated) from the voltage value is included within the range of an allowable estimation error, it is possible to ensure the estimation accuracy of the state of charge.

Because there is a predetermined correlation between the state of charge and the open circuit voltage, when the range of the estimation error of the state of charge is identified, it is possible to identify the allowable range of the open circuit voltage, which corresponds to the range of the estimation error. With the progress of elimination of polarization, the voltage value of the electrical storage device approaches the open circuit voltage, and falls within the above-described allowable range of the open circuit voltage. When the voltage value of the electrical storage device falls within the allowable range of the open circuit voltage, it is possible to ensure the estimation accuracy of the state of charge by calculating the state of charge on the basis of the voltage value. That is, when the voltage value of the electrical storage device falls within the allowable range of the open circuit voltage, it is possible to ensure the estimation accuracy of the state of charge even when the state of charge is calculated in a situation that a voltage value that deviates from the open circuit voltage is regarded as the open circuit voltage.

In this way, the voltage value of the electrical storage device just needs to fall within the allowable range of the open circuit voltage, and polarization does not need to be eliminated to such an extent that the voltage value of the electrical storage device reaches the open circuit voltage. In other words, as long as the voltage value of the electrical storage device falls within the allowable range of the open circuit voltage, polarization may remain in terms of ensuring the estimation accuracy of the state of charge. In eliminating polarization by stopping charging or discharging of the electrical storage device, a time from when charging or discharging is stopped to when polarization still remains is shorter than a time from when charging or discharging is stopped to when polarization is eliminated.

In the invention, the polarization elimination time is set by focusing on the above-described point. The polarization elimination time according to the invention is a time required until the voltage value of the electrical storage device falls within the allowable range of the open circuit voltage, and is a time from when charging or discharging is stopped to when polarization still remains. In the invention, by using the polarization elimination time, the above-described state where polarization still remains (polarization eliminated state) is determined.

As the above-described rate of change increases, the allowable range of the open circuit voltage becomes easy to expand with respect to the range of the estimation error of the state of charge. When the allowable range of the open circuit voltage expands, a time required until the voltage value of the electrical storage device falls within the allowable range of the open circuit voltage shortens in eliminating polarization by stopping charging or discharging of the electrical storage device. In the invention, as the rate of change increases, the polarization elimination time is shortened.

In the invention, when the stopped time is longer than the polarization elimination time, the state of charge of the electrical storage device is calculated in a situation that the voltage value detected by the voltage sensor is regarded as the open circuit voltage of the electrical storage device. As the rate of change increases, it is possible to increase an opportunity to calculate the state of charge from the voltage value by shortening the polarization elimination time. Accordingly, it is possible to increase an opportunity to calculate the full charge capacity of the electrical storage device by using the state of charge calculated from the voltage value.

In the above aspect, the controller may be configured to, when charging or discharging of the electrical storage device is stopped, calculate a variation in the state of charge and a variation in the open circuit voltage on the basis of the state of charge and the open circuit voltage in a period until the charge and discharge is stopped. In addition, the controller may be configured to calculate the rate of change, and calculate the polarization elimination time corresponding to the calculated rate of change by using a correlation between the rate of change and the polarization elimination time. When the variation in the state of charge and the variation in the open circuit voltage are calculated, it is possible to calculate the rate of change. When the behavior (change) of the state of charge in a period until charging or discharging of the electrical storage device is stopped, that is, the behavior (change) of the state of charge while charging or discharging of the electrical storage device is being carried out, is acquired, it is possible to calculate the variation in the state of charge. Similarly, when the behavior (change) of the open circuit voltage in a period until charging or discharging of the electrical storage device is stopped, that is, the behavior (change) of the open circuit voltage while charging or discharging of the electrical storage device is being carried out, is acquired, it is possible to calculate the variation in the open circuit voltage.

When the correlation between the rate of change and the polarization elimination time is used, it is possible to calculate the polarization elimination time corresponding to the calculated rate of change. The thus calculated polarization elimination time is compared with the stopped time. When the stopped time is longer than the polarization elimination time, it is possible to calculate the state of charge of the electrical storage device in a situation that the voltage value detected by the voltage sensor is regarded as the open circuit voltage of the electrical storage device as described above.

As described above, there is a correlation between the rate of change and the polarization elimination time. The rate of change is the ratio of the variation in the open circuit voltage to the variation in the state of charge, so there is also a correlation between the rate of change and the state of charge. In the above aspect, the controller may be configured to calculate the state of charge at the time when charging or discharging of the electrical storage device is stopped. The controller may be configured to calculate the polarization elimination time, corresponding to the calculated state of charge by using a correlation between the rate of change and the polarization elimination time, and a correlation between the rate of change and the state of charge. When the state of charge at the time when charging or discharging of the electrical storage device is stopped is calculated, it is possible to identify the rate of change corresponding to the calculated state of charge by using the correlation between the rate of change and the state of charge. It is possible to identify the polarization elimination time corresponding to the rate of change by using the correlation between the rate of change and the polarization elimination time. Thus, when the state of charge at the time when charging or discharging of the electrical storage device is stopped is calculated, it is possible to calculate the polarization elimination time corresponding to the state of charge.

In the above aspect, the controller may be configured to, while charging or discharging of the electrical storage device is stopped, calculate the polarization elimination time corresponding to the voltage value detected by the voltage sensor by using a correlation between the rate of change and the polarization elimination time and a correlation between the rate of change and the voltage value. The rate of change is the ratio of the variation in the open circuit voltage to the variation in the state of charge, so there is also a correlation between the rate of change and the state of charge. When the voltage value at the time when charging or discharging of the electrical storage device is stopped is regarded as the open circuit voltage, it is possible to identify the rate of change corresponding to the open circuit voltage by using the correlation between the rate of change and the open circuit voltage. It is possible to identify the polarization elimination time corresponding to the rate of change by using the correlation between the rate of change and the polarization elimination time. Thus, when the voltage value at the time when charging or discharging of the electrical storage device is stopped is detected, it is possible to calculate the polarization elimination time corresponding to the voltage value.

In the above aspect, the controller may be configured to, while charging or discharging of the electrical storage device is stopped, repeat detection of the voltage value by the voltage sensor. The controller may be configured to calculate the polarization elimination time corresponding to the detected voltage value each time the voltage value is detected. While charging or discharging of the electrical storage device is stopped, it is possible to repeat detection of the voltage value of the electrical storage device with the use of the voltage sensor. Each time the voltage value is detected, it is possible to calculate the polarization elimination time corresponding to the voltage value. Thus, it is possible to compare the latest calculated polarization elimination time with the stopped time.

As the stopped time extends, elimination of polarization progresses, and the voltage value of the electrical storage device approaches the open circuit voltage. When the voltage value approaching the open circuit voltage is used, it is possible to acquire a more accurate rate of change, and identify a more accurate allowable range of the open circuit voltage. Thus, it is possible to calculate a more accurate polarization elimination time. When the stopped time is longer than the polarization elimination time, the fact that the voltage value of the electrical storage device falls within the allowable range of the open circuit voltage is easy to be identified, so the estimation accuracy of the state of charge is easy to be ensured. Accordingly, the estimation accuracy of the full charge capacity that is calculated from the state of charge is easy to be ensured.

In the above aspect, the electrical storage system may further include a temperature sensor. The temperature sensor may be configured to detect a temperature of the electrical storage device. The controller may be configured to shorten the polarization elimination time as the temperature increases. Polarization of the electrical storage device also depends on the temperature of the electrical storage device. Specifically, as the temperature of the electrical storage device increases, polarization is difficult to increase and polarization is easy, to be eliminated. In other words, as the temperature of the electrical storage device decreases, polarization is easy to increase and polarization is difficult to be eliminated. As the temperature of the electrical storage device increases, it is possible to shorten the polarization elimination time. The temperature of the electrical storage device may be detected by the temperature sensor.

Another aspect of the invention provides an electrical storage system for a vehicle. The electrical storage system includes an electrical storage device, a voltage sensor and a controller. The electrical storage device is configured to be charged with electric power from an external power supply. The external power supply is installed outside the electrical storage device separately from the electrical storage device. The voltage sensor is configured to detect a voltage value of the electrical storage device. The controller is configured to calculate a rate of change in electromotive voltage at at least one of first timing or second timing. The controller is configured to calculate a predetermined standby time on the basis of the rate of change in electromotive voltage. The controller is configured to calculate a state of charge of the electrical storage device, when the predetermined standby time has elapsed from the first timing or the second timing. The controller is configured to calculate a full charge capacity of the electrical storage device by using the calculated state of charge. The controller is configured to shorten the predetermined standby time as the rate of change in electromotive voltage increases. The first timing is predetermined timing in a period from when an ignition switch of the vehicle is switched into an off state to when charging of the electrical storage device with electric power from the external power supply is started. The second timing is predetermined timing during the period when the vehicle is left standing after charging of the electrical storage device with electric power from the external power supply is completed. The rate of change in electromotive voltage is a ratio of a variation in open circuit voltage to a variation in state of charge of the electrical storage device.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 9 is a graph that shows the correlation between an OCV and a rate of change in electromotive voltage.

DETAILED DESCRIPTION OF EMBODIMENTS

Hereinafter, embodiments of the invention will be described.

Figure 1:
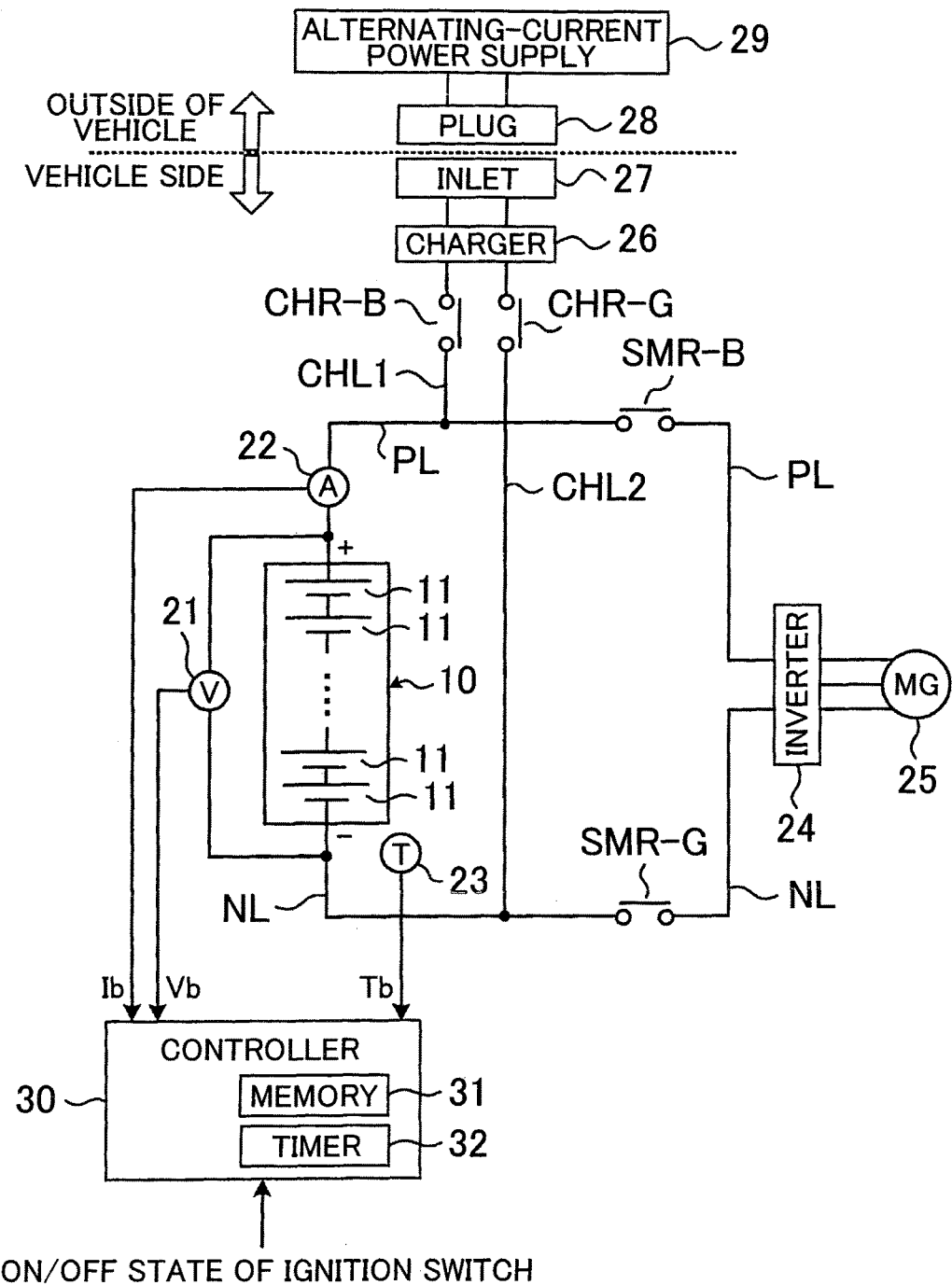
FIG. 1 is a view that shows the configuration of a battery system.

FIG. 1 is a view that shows the configuration of a battery system according to a first embodiment (which corresponds to an electrical storage system according to the invention). The battery system shown in FIG. 1 is mounted on a vehicle. The vehicle is, for example, a plug-in hybrid vehicle (PHV) or an electric vehicle (EV). The PHV includes another power source in addition to a battery pack 10 as a power source for propelling the vehicle. The other power source is an engine or a fuel cell. The EV includes only the battery pack 10 as the power source for propelling the vehicle.

In the present embodiment, the battery pack 10 is mounted on the vehicle; however, the battery pack 10 is not limited to this arrangement. That is, as long as a system that is able to charge the battery pack 10, the invention is applicable.

The battery pack (which corresponds to an electrical storage device according to the invention) 10 includes a plurality of serially connected single cells 11. A secondary battery, such as a nickel-metal hydride battery and a lithium ion battery, may be used as each single cell 11. Instead of the secondary battery, an electric double layer capacitor may be used. The number of the single cells 11 may be set as needed on the basis of a required output, or the like, of the battery pack 10. The battery pack 10 may include a plurality of the single cells 11 that are connected in parallel with each other.

A voltage sensor 21 detects the voltage value Vb of the battery pack 10, and outputs the detected result to a controller 30. A current sensor 22 detects the current value Ib of the battery pack 10, and outputs the detected result to the controller 30. In the present embodiment, the current value Ib at the time when the battery pack 10 is discharged is defined as a positive value. The current value Ib at the time when the battery pack 10 is charged is defined as a negative value. A temperature sensor 23 detects the temperature (battery temperature) Tb of the battery pack 10, and outputs the detected result to the controller 30.

The controller 30 includes a memory 31 and a timer 32. The memory 31 stores various pieces of information, which are used by the controller 30 to execute a predetermined process (particularly, a process described in the present embodiment). The timer 32 is used to measure a time. In the present embodiment, the memory 31 and the timer 32 are incorporated in the controller 30; instead, at least one of the memory 31 or the timer 32 may be provided outside the controller 30. The controller 30 may operate upon reception of electric power from a power supply different from the battery pack 10. The power supply is, for example, an auxiliary battery mounted on the vehicle. The auxiliary battery may be charged with electric power discharged from the battery pack 10.

A positive electrode line PL is connected to the positive electrode terminal of the battery pack 10. A negative electrode line NL is connected to the negative electrode terminal of the battery pack 10. A system main relay SMR-B is provided in the positive electrode line PL. A system main relay SMR-G is provided in the negative electrode line NL. The system main relays SMR-B, SMR-G each switch between an on state and an off state upon reception of a drive signal from the controller 30.

Information about the on/off state of an ignition switch is input to the controller 30. When the ignition switch switches from the off state to the on state, the controller 30 outputs drive signals for switching, the system main relays SMR-B, SMR-G into the on state. When the ignition switch switches from the on state to the off state, the controller 30 outputs drive signals for switching the system main relays SMR-B, SMR-G into the off state.

The battery pack 10 is connected to an inverter 24 via the positive electrode line PL and the negative electrode line NL. When the system main relays SMR-B, SMR-G are in the on state, the battery pack 10 is connected to the inverter 24, and the battery system shown in FIG. 1 enters an activated state (ready-on state). When the system main relays SMR-B, SMR-G are in the off state, connection of the battery pack 10 with the inverter 24 is interrupted, and the battery system shown in FIG. 1 enters a stopped state (ready-off state).

The inverter 24 converts direct-current power, output from the battery pack 10, to alternating-current power, and outputs the alternating-current power to a motor generator (MG) 25. The motor generator 25 generates kinetic energy (power) for propelling the vehicle upon reception of the alternating-current power output from the inverter 24. The kinetic energy generated by the motor generator 25 is transmitted to wheels, thus making it possible to propel the vehicle.

When the vehicle is decelerated or the vehicle is stopped, the motor generator 25 converts kinetic energy, generated during braking of the vehicle, to electric energy (alternating-current power). The inverter 24 converts alternating-current power, generated by the motor generator 25, to direct-current power, and outputs the direct-current power to the battery pack 10. Thus, the battery, pack 10 stores regenerative electric power.

In the battery system according to the present embodiment, a step-up circuit may be provided in a current path between the battery pack 10 and the inverter 24. The step-up circuit is able to step up the output voltage of the battery pack 10 and then to output the stepped-up electric power to the inverter 24. The step-up circuit is able to step down the output voltage of the inverter 24 and then to output the stepped-down electric power, to the battery pack 10.

A charging line CHL1 is connected to the positive electrode line PL between the positive electrode terminal of the battery pack 10 and the system main relay SMR-B. A charging line CHL2 is connected to the negative electrode line NL between the negative electrode terminal of the battery pack 10 and the system main relay SMR-G. A charger 26 is connected to the charging lines CHL1, CHL2. A charging relay CHR-B is provided in the charging line CHL1 between the charger 26 and the positive electrode line PL. A charging relay CHR-G is provided in the charging line CHL2 between the charger 26 and the negative electrode line NL.

The charging relays CHR-B, CHR-G each switch between an on state and an off state upon reception of a drive signal from the controller 30. An inlet (so-called connector) 27 is connected to the charger 26 via the charging lines CHL1, CHL2. A plug (so-called connector) 28 is connected to the inlet 27. That is, the plug 28 may be connected to the inlet 27, or the plug 28 may be disconnected from, the inlet 27.

The plug 28 is connected to an alternating-current power supply (which corresponds to an external power supply according to the invention) 29. For example, a commercial power supply may be used as the alternating-current power supply 29. The plug 28 and the alternating-current power supply 29 are installed separately from the vehicle outside the vehicle. When the plug 28 is connected to the inlet 27 and the charging relays CHR-B, CHR-G are in the on state, it is possible to charge the battery pack 10 with electric power from the alternating-current power supply 29. This charging is termed external charging.

When external charging is carried out, the charger 26 converts alternating-current power from the alternating-current power supply 29 to direct-current power, and outputs the direct-current power to the battery-pack 10. The charger 26 is able to step up, the output voltage of the alternating-current power supply 29 and then to output the stepped-up electric power to the battery pack 10. The controller 30 controls the operation of the charger 26.

A system that supports external charging is not limited to the system shown in FIG. 1. Specifically, as long as a system is able to charge the battery pack 10 with electric power from a power supply installed outside the vehicle (external power supply), the invention is applicable.

For example, the charging line CHL1 may be connected to the positive electrode line PL between the system main relay SMR-B and the inverter 24. The charging line CHL2 may be connected to, the negative electrode line NL between the system main relay SMR-G and the inverter 24. In this case, when external charging is carried out, not only the charging relays CHR-B, CHR-G but, also the system main relays SMR-B, SMR-G need to be switched into the on state.

In the present embodiment, the alternating-current power supply 29 is used. Instead of the alternating-current power supply 29, a direct-current power supply (which corresponds to the external power supply according to the invention) may be used. In this case, the charger 26 may be omitted. Supply of electric power from the external power supply is not limited to supply of electric power with the use of a cable. Instead, a so-called contactless charging system may be used. In the contactless charging system, it is possible to supply electric power by utilizing electromagnetic induction or a resonance phenomenon without any cable. A known configuration may be employed as the contactless charging system as needed.

In the present embodiment, when external charging has been carried out, the full charge capacity of the battery pack 10 is calculated (estimated). The full charge capacity of the battery pack 10 is calculated on the basis of the following mathematical expression (1).

$$FCC = \frac{\Sigma Ib}{SOC\_e - SOC\_s} \quad (1)$$

In the above mathematical expression (1), FCC is the full charge capacity of the battery pack 10. SOC_s is the state of charge (SOC) of the battery pack 10 at the time when external charging is started. SOC_e is the SOC of the battery pack 10 at the time when external charging is completed. ΣIb is a value obtained by accumulating the current value (charge current) Ib (accumulated current value) in a period from the start of external charging to the completion of external charging. The current value Ib is detected by the current sensor 22. As described above, the current value (charge current) Ib is a negative value, so, when the accumulated current value ΣIb is calculated, the absolute value of the current value (charge current) Ib is used.

The SOC indicates the ratio of a level of charge to the full charge capacity FCC. Because there is a correlation between an SOC and an open circuit voltage (OCV), when the correlation is obtained in advance, it is possible to calculate (estimate) the SOC of the battery pack 10 from the OCV of the battery pack 10. Specifically, by using the voltage value Vb detected by the voltage sensor 21, it is possible to calculate the SOC of the battery pack 10. When the voltage value Vb is detected while the battery pack 10 is not being charged or discharged, a voltage variation resulting from charging or discharging (energization) is not included in the voltage value Vb, and the voltage value Vb approaches the OCV.

On the other hand, polarization occurs when the battery pack 10 is charged or discharged, with the result that a voltage variation resulting from the polarization is included in the voltage value Vb detected by the voltage sensor 21. Thus, the voltage value Vb deviates from the OCV. After the polarization has been eliminated, the voltage value Vb at this time may be regarded as the OCV of the battery pack 10. If the voltage value Vb at the time when the polarization remains is regarded as the OCV, a voltage variation resulting from the polarization becomes an estimation error of the OCV.

When charging or discharging of the battery pack 10 is kept stopped, it is possible to eliminate the polarization. Therefore, a time for eliminating polarization (referred to as polarization elimination time) is set in advance, and, when a time during the period when charging or discharging of the battery pack 10 is stopped is longer than the polarization elimination time, it may be determined that the polarization has been eliminated.

In the present embodiment, the polarization elimination time is changed on the basis of a rate of change in electromotive voltage (which corresponds to a rate of change according to the invention). The polarization elimination time according to the present embodiment is not equal to a time required until polarization is completely eliminated as will be described later. The rate of change in electromotive voltage is the ratio of a variation in OCV (ΔOCV) to a variation in SOC (ΔSOC). Specifically, the rate of change in electromotive voltage is a value (ΔOCV/ΔSOC) obtained by dividing the variation ΔOCV by the variation ΔSOC. The SOC is the SOC of the battery pack 10. The OCV is the OCV of the battery pack 10.

In the present embodiment, as the rate of change in electromotive voltage increases, the polarization elimination time is shortened. In other words, as the rate of change in electromotive voltage shortens, the polarization elimination time is extended. The reason why the polarization elimination time is changed in this way, will be described below.

When the full charge capacity FCC of the battery pack 10 is calculated (estimated) on the basis of the above-described mathematical expression (1), it is required to bring an estimation error (an error with respect to a true value) of each of the SOC_s and the SOC_e into an allowable range ΔSOC_err. This is because, for, each of the SOC_s and the SOC_e, when a difference between an estimated value and a true value falls outside the allowable range ΔSOC_err, it is difficult to ensure the estimation accuracy of the full charge capacity FCC. As the allowable range ΔSOC_err is narrowed, it is possible to improve the estimation accuracy of the full charge capacity FCC. It is possible to set the allowable range ΔSOC_err as needed in consideration of the accuracy of estimating the full charge capacity FCC.

Because there is a correlation between an SOC and an OCV, it is possible to set an allowable range of the OCV, which corresponds to the allowable range ΔSOC_err. When the voltage value Vb of the battery pack 10 falls within the allowable range of the OCV, the SOC corresponding to the voltage value Vb, when calculated by using the correlation between an OCV and an SOC, falls within the allowable range ΔSOC_err. That is, when the voltage value Vb falls within the allowable range of the OCV, it is possible to calculate the SOC by regarding the voltage value Vb as the OCV. Because the thus calculated SOC falls within the allowable range ΔSOC_err, it is possible to ensure the estimation accuracy of the full charge, capacity FCC.

Figure 2:
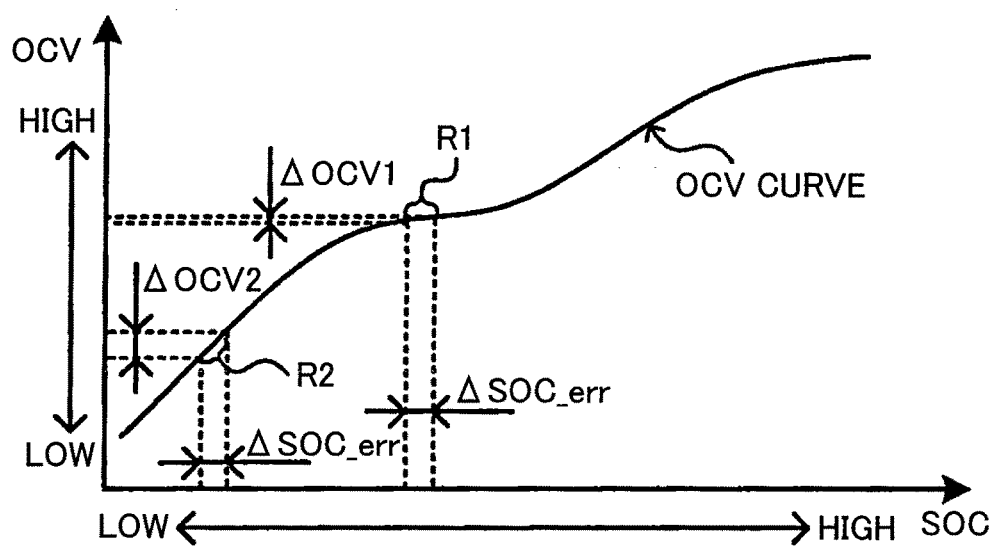
FIG. 2 is a graph that shows the correlation (OCV curve) between an OCV and an SOC.

As shown in FIG. 2, the allowable range of the OCV, corresponding to the allowable range ΔSOC_err, varies with the rate of change in electromotive voltage. FIG. 2 shows the correlation (so-called OCV curve) between an OCV and an SOC. In FIG. 2, the ordinate axis represents OCV, and the abscissa axis represents SOC.

As shown in FIG. 2, the rate of change in electromotive voltage in a region R1 of the OCV curve is lower than the rate of change in electromotive voltage in a region R2 of the OCV curve. In order to bring an estimation error of the SOC within the allowable range ΔSOC_err in the region R1, the voltage value Vb that is used to calculate (estimate) the SOC needs to fall within the allowable range ΔOCV1. The allowable range ΔOCV1 corresponds to the allowable range ΔSOC_err in the region R1. The OCV of the battery pack 10 is included in the allowable range ΔOCV1.

The voltage value Vb just after charging or discharging of the battery pack 10 is stopped can fall outside the allowable range ΔOCV1. In this case, polarization just needs to be eliminated until the voltage value Vb falls within the allowable range ΔOCV1. Polarization may remain as long as the voltage value Vb falls within the allowable range ΔOCV1. The polarization elimination time according to the present embodiment is a time required until the voltage value Vb falls within the allowable range ΔOCV1. By using the polarization elimination time, a state where the voltage value Vb falls within the allowable range ΔOCV1 (polarization eliminated state) is determined although polarization still remains.

In order to bring an estimation error of the SOC into the allowable range ΔSOC_err in the region R2, the voltage value Vb that is used to calculate (estimate) the SOC needs to fall within the allowable range ΔOCV2. The allowable range ΔOCV2 corresponds to the allowable range ΔSOC_err in the region R2. The OCV of the battery pack 10 is included in the allowable range ΔOCV2. The allowable range ΔSOC_err in the region R2 is the same as the allowable range ΔSOC_err in the region R1. Depending on the OCV curve, there may arise a region in which the variation ΔOCV becomes "0" to the variation ΔSOC. At this time, only a specific OCV can correspond to the allowable range ΔSOC_err.

The voltage value Vb just after charging or discharging of, the battery pack 10 is stopped can fall outside the allowable range ΔOCV2. In this case, polarization just needs to be eliminated until the voltage value Vb falls within the allowable range ΔOCV2. Polarization may remain as long as the voltage value Vb falls within the allowable range ΔOCV2. As is apparent from FIG. 2, the allowable range ΔOCV2 is wider than the allowable range ΔOCV1. The polarization elimination time according to the present embodiment is a time required until the voltage value Vb falls within the allowable range ΔOCV2. By using the polarization elimination time, a state where the voltage value Vb falls within the allowable range ΔOCV2 (polarization eliminated state) is determined although polarization still remains.

Because the allowable range ΔOCV1 is narrower than the allowable range ΔOCV2, it is not possible to bring the voltage value Vb into the allowable range ΔOCV1 in the region R1 unless polarization is eliminated by a larger amount than that in the region R2. In other words, in the region R1, it is not possible to bring the voltage value Vb into the allowable range ΔOCV1 unless a time during the period when charging or discharging of the battery pack 10 is stopped is longer than that in the region R2.

The rate of change in electromotive voltage in the region R1 is lower than the rate of change in electromotive voltage in the region R2. The polarization elimination time needs to be extended as the rate of change in electromotive voltage decreases. In other words, as the rate of change in electromotive voltage increases, it is possible to shorten the polarization elimination time. As described above, the polarization elimination time according to the present embodiment is a time during the period when polarization is eliminated until the voltage value Vb falls within the allowable range (ΔOCV1, ΔOCV2) of the OCV.

When the allowable range ΔSOC_err for ensuring the estimation accuracy of the full charge capacity FCC is taken into consideration, it is possible to change the polarization elimination time in accordance with the rate of change in electromotive voltage. When it is determined whether polarization has been eliminated, it is possible to set the polarization elimination time according to the rate of change in electromotive voltage.

In the present embodiment, when the polarization elimination time is set, not only the rate of change in electromotive voltage but also the battery temperature Tb is taken into consideration. A polarization occurrence state and a polarization eliminated state depend on the battery temperature Tb. Specifically, as the battery temperature Tb decreases, polarization becomes easy to increase or polarization becomes difficult to be eliminated. In other words, as the battery temperature Tb increases, polarization becomes difficult to increase or polarization becomes easy to be eliminated.

Figure 3:
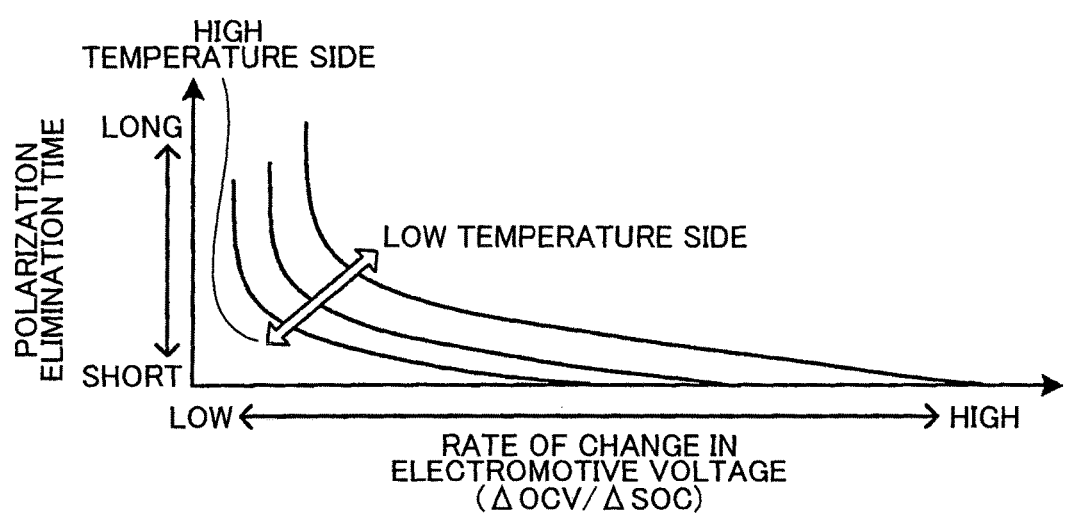
FIG. 3 is a graph that shows the correlation between a rate of change in electromotive voltage and a polarization elimination time.

Therefore, the polarization elimination time is set in consideration of not only the rate of change in electromotive voltage but also the battery temperature Tb. Specifically, when a correlation (one example) shown in FIG. 3 is obtained in advance by an experiment, or the like, it is possible to set the polarization elimination time by identifying the rate of change in electromotive voltage and the battery temperature Tb. In FIG. 3, the ordinate axis represents polarization elimination time, and the abscissa axis represents rate of change in electromotive voltage.

As shown in FIG. 3, as the rate of change in electromotive voltage increases, the polarization elimination time shortens. In other words, as the rate of change in electromotive voltage decreases, the polarization elimination time extends. For the same rate of change in electromotive voltage as well, as the battery temperature Tb decreases, the polarization elimination time extends. In other words, for the same rate of change in electromotive voltage as well, as the battery temperature Tb increases, the polarization elimination time shortens.

The correlation shown in FIG. 3 may be expressed by a map or an arithmetic expression and may be stored in the memory 31. When the polarization elimination time is calculated by using the correlation shown in FIG. 3, it is required to identify the rate of change in electromotive voltage and the battery temperature Tb. The battery temperature Tb may be detected by the temperature sensor 23. When the variation ΔSOC and the variation ΔOCV are calculated, the rate of change in electromotive voltage may be calculated. By acquiring the behavior (change) of the SOC of the battery pack 10, the variation ΔSOC may be calculated. By acquiring the behavior (change) of the OCV of the battery pack 10, the variation ΔOCV may be calculated.

In the present embodiment, the polarization elimination time is calculated on the basis of the rate of change in electromotive voltage and the battery temperature Tb; however, calculation of the polarization elimination time is not limited to this configuration. Specifically, it is possible to calculate the polarization elimination time from the rate of change in electromotive voltage without consideration of the battery temperature Tb.

When the full charge capacity FCC of the battery pack 10 is calculated as described above, the full charge capacity FCC is used to calculate (estimate) the SOC of the battery pack 10 during traveling of the vehicle. Specifically, the SOC of the battery pack 10 during traveling of the vehicle may be calculated on the basis of the following mathematical expression (2).

$$\text{SOC\_cur} = \text{SOC\_ref} + \frac{\Sigma Ib}{FCC} \qquad (2)$$

In the above mathematical expression (2), SOC_cur is a current SOC of the battery pack 10. SOC_ref is the SOC of the battery pack 10 at the time when the ignition switch switches from the off state to the on state. When the OCV of the battery pack 10 at the time when the ignition switch switching into the on state is identified, it is possible to calculate the SOC_ref on the basis of the correlation between an OCV and an SOC. ΣIb is a value obtained by accumulating the current value Ib of the battery pack 10 (accumulated current value) after the ignition switch switches into the on state. FCC is the full charge capacity of the battery pack 10.

According to the above-described mathematical expression (2), after the ignition switch switches into the on state, by continuing to, detect the current value Ib of the battery pack 10, it is possible to acquire the SOC_cur of the battery pack 10. That is, it is possible to acquire the SOC (SOC_cur) of the battery pack 10 during traveling of the vehicle.

For the full charge, capacity FCC shown in the above-described mathematical expression (2), only the latest calculated, full charge capacity FCC may be used or a value obtained by correcting the previous full charge capacity FCC with the latest full charge capacity FCC may be used. When the previous full charge capacity FCC is corrected with the latest full charge capacity FCC, it is possible to, for example, assign weights to the previous full charge capacity FCC and the latest full charge capacity FCC and then add these full charge capacities FCC together. The added full charge capacity FCC may be used as the full charge capacity FCC shown in the above-described mathematical expression (2).

Figure 4:
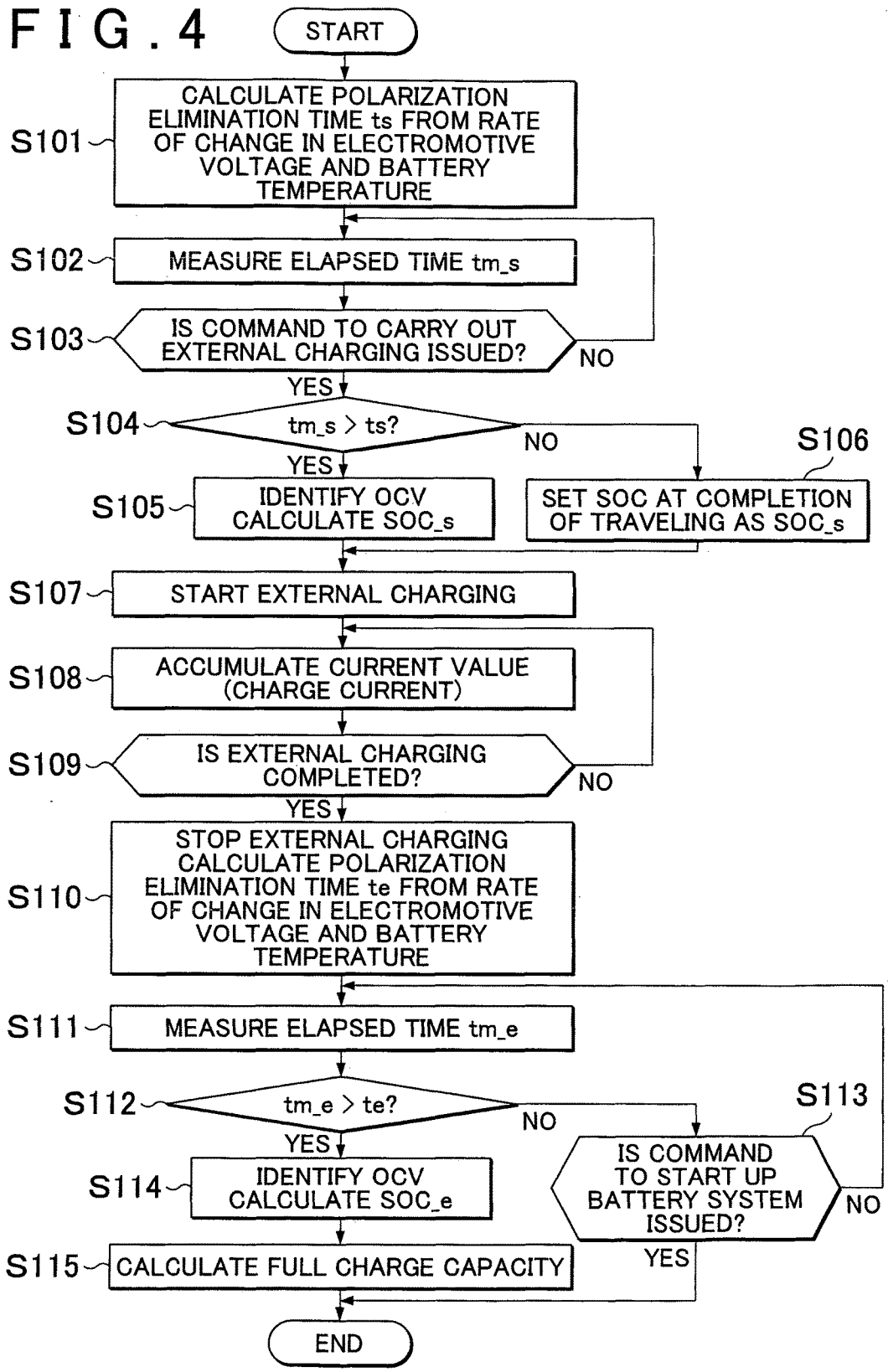
FIG. 4 is a flowchart that illustrates the process of calculating a full charge capacity of a battery pack according to a first embodiment.

Next, the process of calculating the full charge capacity FCC will be described with reference to the flowchart shown in FIG. 4. The process shown in FIG. 4 is executed by the controller 30. When the plug 28 is connected to the inlet 27 and the battery system is set to a stopped state in response to switching of the ignition switch into the off state, the process shown in FIG. 4 is started.

In step S101, the controller 30 calculates a polarization elimination time ts from the rate of change in electromotive voltage and the battery temperature Tb. As described above, by using the correlation shown in FIG. 3, it is possible to calculate the polarization elimination time ts from the rate of change in electromotive voltage and the battery temperature Tb. The battery temperature Tb is detected by the temperature sensor 23. For example, the rate of change in electromotive voltage may be calculated by a method that will be described below.

When the variation ΔSOC and the variation ΔOCV within a predetermined time required until the ignition switch switches into the off state are calculated, the rate of change in electromotive voltage may be calculated. In calculating the variation ΔSOC, when the current value Ib at which the battery pack 10 is charged or discharged is detected within the predetermined time, a value (accumulated current value) ΣIb obtained by accumulating these current values Ib may be calculated. When the calculated accumulated current value ΣIb is divided by the full charge capacity FCC of the battery pack 10, the variation ΔSOC may be calculated.

Figure 5:
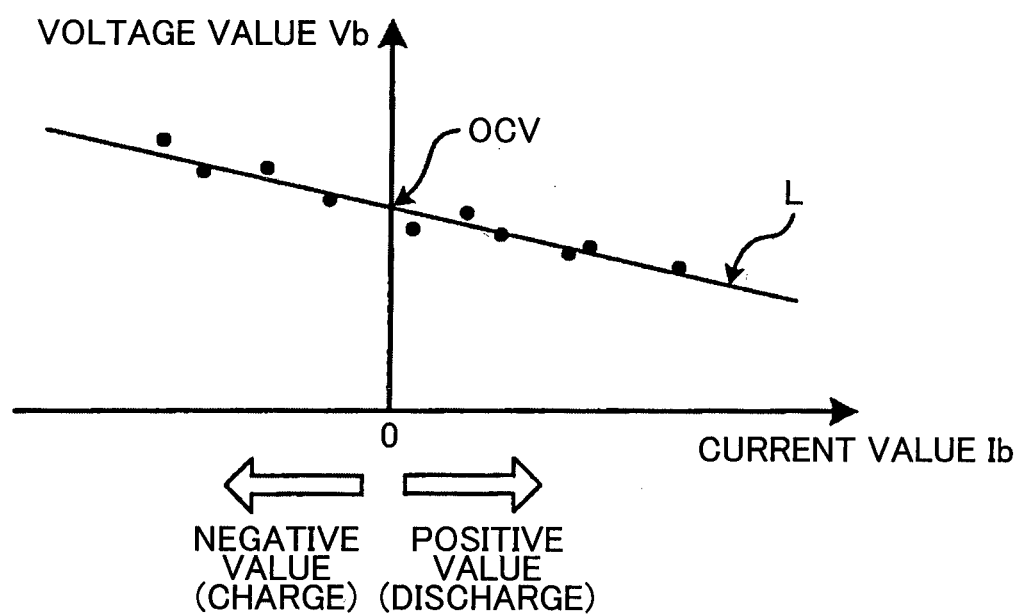
FIG. 5 is a graph that illustrates a method of calculating an OCV.

On the other hand, when a change in the OCV of the battery pack 10 is acquired within the predetermined time required until the ignition switch switches into the off state, the variation ΔOCV may be calculated. The OCV of the battery pack 10 may be calculated from the current value Ib and the voltage value Vb. Specifically, when the battery pack 10 is being charged or discharged, the current value Ib and the voltage value Vb are detected. As shown in FIG. 5, in a coordinate system of which coordinate axes respectively represent the current value Ib and the voltage value Vb, pairs of current value Ib and voltage value Vb are plotted. When a line L approximate to the plurality of plots is calculated, the voltage value Vb on the line L in the case where the current value Ib is 0 [A] is the OCV.

In step S102, the controller 30 measures an elapsed time (which corresponds to a stopped time according to the invention) tm_s with the use of the timer 32. The elapsed time tm_s is an elapsed time from when charging or discharging of the battery pack 10 is stopped as a result of switching of the ignition switch into the off state. When the system main relays SMR-B, SMR-G are switched from the on state to the off state, measurement of the elapsed time tm_s is started.

In step S103, the controller 30 determines whether a command to carry out external charging is issued. The controller 30 measures the elapsed time tm_s until a command to carry out external charging is issued. When the plug 28 is connected to the inlet 27, a command to carry out external charging can be input to the controller 30. Thus, the controller 30 is able to determine that a command to carry out external charging is issued.

On the other hand, the plug 28 is connected to the inlet 27, and then time at which external charging is started (referred to as charging start time) can be set. In this case, when the current time becomes the charging start time, the controller 30 determines that a command to carry out external charging is issued. Not the charging start time but scheduled time for starting up the vehicle (referred to start-up time) can be set. At this time, the charging start time is set so that external charging completes before the start-up time.

When a command to carry out external charging is issued, the controller 30 determines in step S104 whether the elapsed time tm_s is longer than the polarization elimination time ts. The elapsed time tm_s is a time from when measurement of the time tm_s is started to when a command to carry out external charging is issued. The polarization elimination time ts is a time calculated in the process of step S101. When the elapsed time tm_s is longer than the polarization elimination time ts, the controller 30 executes the process of step S105. On the other hand, when the elapsed time tm_s is shorter than or equal to the polarization elimination time ts, the controller 30 executes the process of step S106.

In step S105, the controller 30 detects the voltage value Vb of the battery pack 10 with the use of the voltage sensor 21, and regards the voltage value Vb as the OCV of the battery pack 10. This voltage value Vb may be considered to be included in the above-described allowable range (ΔOCV1, ΔOCV2 shown in FIG. 2) of the OCV. Thus, the controller 30 calculates the SOC corresponding to the voltage value Vb regarded as the OCV (which corresponds to the above-described SOC_s) by using the correlation between an OCV and an SOC.

In step S106, the controller 30 sets the SOC of the battery pack 10 at the completion of traveling as the SOC_s. In other words, the controller 30 sets the SOC of the battery pack 10 at the time of switching of the ignition switch from the on state to the off state as the SOC_s. As described above, while the vehicle is traveling, the SOC of the battery pack 10 is calculated (estimated), so it is possible to identify the SOC of the battery pack 10 at the time of switching of the ignition switch from the on state to the off state.

In step S107, the controller 30 starts external charging by operating the charger 26 through switching of the charging relays CHR-B, CHR-G into the on state. In step S108, the controller 30 calculates the accumulated current value ΣIb by accumulating the current value (charge current) Ib detected by the current sensor 22 during external charging.

In step S109, the controller 30 determines whether to complete external charging. For example, when the voltage value Vb of the battery pack 10, detected by the voltage sensor 21, has reached a target voltage value at which external charging is completed, the controller 30 may determine to complete external charging. The target voltage value at which external charging is completed may be set as needed. For example, the voltage value Vb at the time when the battery pack 10 is in a full charge state may be set as the target voltage value at which external charging is completed. On the other hand, when the accumulated current value ΣIb has reached a target accumulated value, the controller 30 may determine to complete external charging. The target accumulated value may be set as needed.

Until it is determined to complete external charging, the accumulated current value ΣIb is calculated in the process of step S108. When it is determined to complete external charging, the controller 30 stops external charging in step S110. Specifically, the controller 30 stops the operation of the charger 26, and switches the charging relays CHR-B, CHR-G from the on state to the off state. In step S110, the controller 30 calculates a polarization elimination time to from the rate of change in electromotive voltage and the battery temperature Tb.

The polarization elimination time te is calculated as in the case of the polarization elimination time ts. Specifically, by using the correlation shown in FIG. 3, the polarization elimination time te corresponding to the rate of change in electromotive voltage and the battery temperature Tb is calculated. The battery temperature Tb is detected by the temperature sensor 23. When the variation ΔSOC and the variation ΔOCV are calculated within the predetermined time required until external charging is stopped, the rate of change in electromotive voltage may be calculated.

When the current value Ib at which the battery pack 10 is charged is detected within the predetermined time required until external charging is stopped, a value (accumulated current value) ΣIb obtained by accumulating these current values Ib may be calculated. When the calculated accumulated current value ΣIb is divided by the full charge capacity FCC of the battery pack 10, the variation ΔSOC may be calculated. On the other hand, when a change in the OCV of the battery pack 10 is acquired within the predetermined time required until external charging is stopped, the variation ΔOCV may be calculated. As described with reference to FIG. 5, the OCV may be calculated from the current value Ib and the voltage value Vb. When the OCV is calculated by the method shown in FIG. 5, it is required to change the current value Ib during external charging.

On the other hand, when the voltage value Vb of the battery pack 10 is detected while external charging is being carried out at a constant current, a change in the voltage value Vb may be acquired. Thus, a variation in the voltage value Vb may be calculated within the predetermined time required until external charging is stopped, and the calculated variation may be regarded as the variation ΔOCV.

In step S111, the controller 30 measures the elapsed time (which corresponds to the stopped time according to the invention) tm_e with the use of the timer 32. The elapsed time tm_e is an elapsed time from when external charging is stopped. In step S112, the controller 30 determines whether the elapsed time tm_e is longer than the polarization elimination time te. The polarization elimination time te is a time calculated in the process of step S110. The elapsed time tm_e is a time from when external charging is stopped to the present.

When the elapsed time tm_e is shorter than or equal to the polarization elimination time te, the controller 30 determines in step S113 whether a command to start up the battery system shown in FIG. 1 is issued. This command is to switch the ignition switch into the on state. When a command to start up the battery system is issued, the controller 30 ends the process shown in FIG. 4. On the other hand, when no command to start up the battery system is issued, the controller 30 continues measuring the elapsed time tm_e in the process of step S111.

When the elapsed time tm_e is longer than the polarization elimination time te, the controller 30 executes the process of step S114. In step S114, the controller 30 detects the voltage value Vb of the battery pack 10 with the use of the voltage sensor 21, and regards the voltage value Vb as the OCV of the battery pack 10. The voltage value Vb may be considered to be included in the above-described allowable range (ΔOCV1, ΔOCV2 shown in FIG. 2) of the OCV. Thus, the controller 30 calculates the SOC corresponding to the voltage value Vb regarded as the OCV (which corresponds to the above-described SOC_e) by using the correlation between an OCV and an SOC.

In step S115, the controller 30 calculates the full charge capacity FCC of the battery pack 10 on the basis of the above-described mathematical expression (1). The SOC_s identified in the process of step S105 or step S106 is used as the SOC_s shown in the above-described mathematical expression (1). The SOC_e calculated in the process of step S114 is used as the SOC_e shown in the above-described mathematical expression (1). The accumulated current value ΣIb calculated in the process of step S108 is used as the accumulated current value ΣIb shown in the above-described mathematical expression (1).

In the processes shown in FIG. 4, the polarization elimination times ts, te are calculated; instead, one of the polarization elimination times ts, te may be calculated. In this case, one of the processes of step S104 and step S112 shown in FIG. 4 is executed. In the processes of step S105 and step S114 shown in FIG. 4, an opportunity to calculate the SOC from the OCV is obtained. When the polarization elimination time ts is not calculated, a predetermined time (fixed value) may be used as the polarization elimination time ts. Similarly, when the polarization elimination time te is not calculated, a predetermined time (fixed value) may be used as the polarization elimination time te.

In the processes shown in FIG. 4, when the elapsed time tm_e is shorter than or equal to the polarization elimination time te and a command to start up the battery system is issued, the full charge capacity FCC of the battery pack 10 is not calculated. However, in this case as well, the full charge capacity FCC of the battery pack 10 may be calculated.

For example, when the SOC of the battery pack 10 is calculated during external charging, the SOC at the time when external charging is stopped may be used as the SOC_e. On the other hand, after external charging is stopped, the voltage value Vb of the battery pack 10 is detected with the use of the voltage sensor 21, and the voltage value Vb may be regarded as the OCV of the battery pack 10. By using the correlation between an OCV and an SOC, the SOC corresponding to the OCV may be used as the SOC_e. When the SOC_e is identified, it is possible to calculate the full charge capacity FCC of the battery pack 10 as described above.

Figure 6:
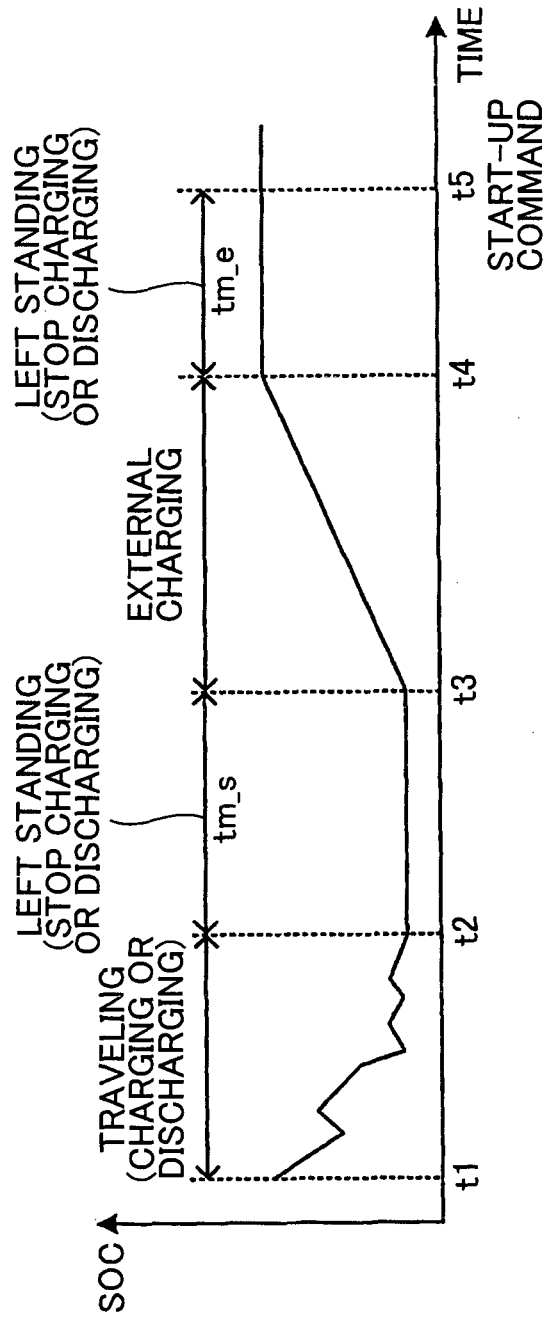
FIG. 6 is a time chart that shows the behavior of the SOC of the battery pack.

FIG. 6 shows, the behavior (one example) of the SOC of the battery pack 10. In FIG. 6, the ordinate axis represents the SOC of the battery pack 10, and the abscissa axis represents time. Between time t1 and time t2, the vehicle travels, and the battery pack 10 is charged or discharged in response to the traveling state of the vehicle. The ignition switch is switched from the on state to the off state at time t2. At time t2, the polarization elimination time ts is calculated, and measurement of the elapsed time tm_s is started. The polarization elimination time ts is calculated from the battery temperature Tb at time t2 and the rate of change in electromotive voltage within the predetermined time until time t2.

Between time t2 and time t3, the vehicle is left standing, and charging or discharging of the battery pack 10 is stopped. At time t3, external charging is started upon reception of a command to carry out external charging. A time from time t2 to time t3 is the elapsed time tm_s. In the processes shown in FIG. 4, it is determined whether the elapsed time tm_s is longer than the polarization elimination time ts. When the elapsed time tm_s is longer than the polarization elimination time ts, the OCV of the battery pack 10 at time t3 is identified, and the SOC_s corresponding to the identified OCV is calculated. When the elapsed time tm_s is shorter than or equal to the polarization elimination time ts, the SOC of the battery pack 10 at time t2 is used as the SOC_s.

Between time t3 and time t4, external charging is carried out. The SOC of the battery pack 10, increases as a result of external charging. At time t4, external charging is stopped. At time t4, the polarization elimination time te is calculated, and measurement of the elapsed time tm_e is started. Between time t4 and time t5, the vehicle is left standing, and charging or discharging of the battery pack 10 is stopped. At time t5, a command to start up the battery system is issued.

A time from time t4 to time t5 becomes the elapsed time tm_e, and, in the processes shown in FIG. 4, it is determined whether the elapsed time tm_e is longer than the polarization elimination time te. When the elapsed time tm_e is longer than the polarization elimination time te, the OCV of the battery pack 10 at time t5 is identified, and the SOC_e corresponding to the OCV is calculated. When the elapsed time tm_e is shorter than or equal to the polarization elimination time te, the SOC_e is not calculated, and the full charge capacity FCC is also not calculated. However, even when the elapsed time tm_e is shorter than or equal to the polarization elimination time te, the full charge capacity FCC may be calculated as described above.

In the present embodiment, the polarization elimination times ts, te are changed in response to the rate of change in electromotive voltage or the battery temperature Tb. As described with reference to FIG. 3, as the rate of change in electromotive voltage increases, the polarization elimination times ts, te may be shortened. Thus, an opportunity for the elapsed times tm_s, tm_e to be respectively longer than the polarization elimination times ts, te increases, so it is possible to increase an opportunity to execute the processes of step S105 and S114 shown in FIG. 4.

In estimating the SOC, in terms of ensuring the estimation accuracy of the SOC, it is preferable to calculate (estimate) the SOC from the OCV (including the voltage value Vb within the allowable range of the OCV). Therefore, it is preferable to increase an opportunity to execute the processes of step S105 and step S114. On the other hand, when the estimation accuracy of the SOC is ensured, it is possible to ensure the estimation accuracy of the full charge capacity FCC. Thus, when the full charge capacity FCC is calculated (estimated), it is preferable to use the SOC that is calculated from the OCV (including the voltage value Vb within the allowable range of the OCV). By increasing an opportunity to execute the processes of step S105 and step S114, it is possible to increase an opportunity to calculate the full charge capacity FCC by using the SOC that is calculated from the OCV (including the voltage value Vb within the allowable range of the OCV).

A second embodiment of the invention will be described. Like reference numerals denote the same components to those described in the first embodiment, and the detailed description thereof is omitted. Hereinafter, the difference from the first embodiment will be mainly described.

The rate of change in electromotive voltage is a value obtained by dividing the variation ΔOCV by the variation ΔSOC, and depends on the correlation (OCV curve) between an OCV and an SOC as described with reference to FIG. 2. Therefore, there is a correlation shown in FIG. 7 between a rate of change in electromotive voltage and an SOC. The correlation shown in FIG. 7 may be calculated on the basis of the OCV curve shown in FIG. 2. The gradient of a tangent to the OCV curve passing through the SOC (one point) of the OCV curve becomes the rate of change in electromotive voltage. Thus, the correlation shown in FIG. 7 is obtained.

Figure 7:
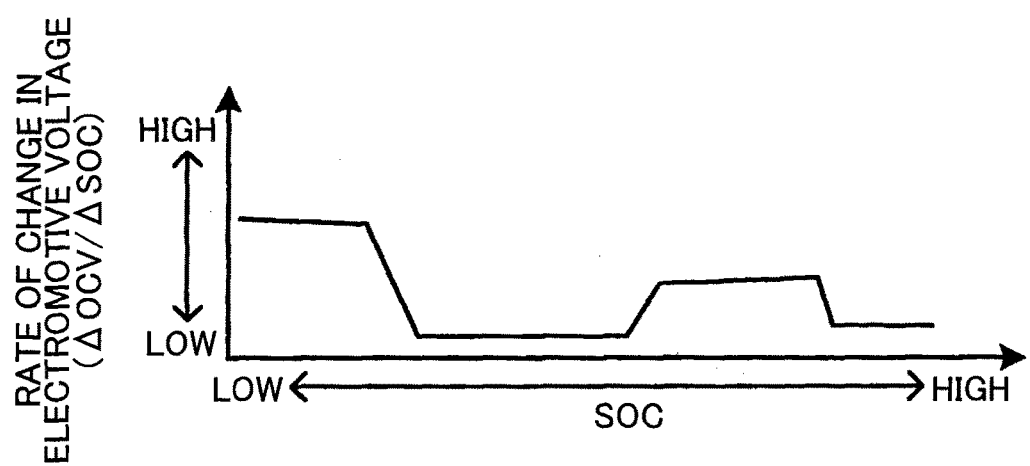
FIG. 7 is a graph that shows the correlation between an SOC and a rate of change in electromotive voltage.

In the first embodiment, the polarization elimination times ts, te are calculated from the rate of change in electromotive voltage; however, when the correlation shown in FIG. 7 is used, the polarization elimination times ts, te may be calculated from the SOC of the battery pack 10. When the SOC of the battery pack 10 is calculated (estimated), the rate of change in electromotive voltage, corresponding to the SOC, may be identified by using the correlation shown in FIG. 7. When the rate of change in electromotive voltage is identified, it is possible to identify the polarization elimination times ts, te by using the correlation shown in FIG. 3. As in the case of the first embodiment, when the polarization elimination times ts, te are calculated, the battery temperature Tb may be taken into consideration.

Figure 8:
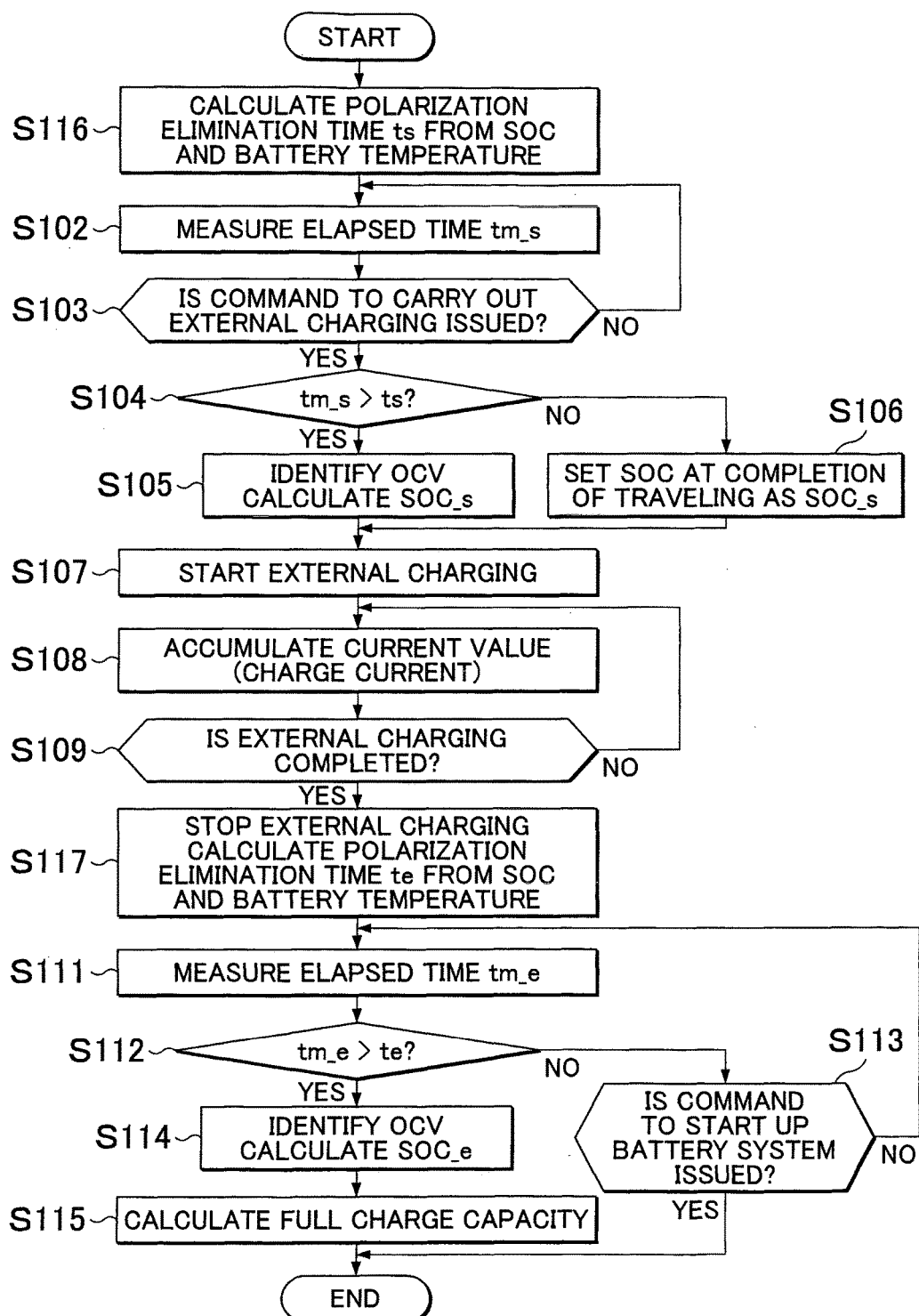
FIG. 8 is a flowchart that illustrates the process of calculating a full charge capacity of a battery pack according to a second embodiment.

In the present embodiment, the polarization elimination times ts, te are calculated from the SOC of the battery pack 10 without calculating the rate of change in electromotive voltage. The flowchart shown in FIG. 8 shows the process of calculating the full charge capacity of the battery pack 10 in the present embodiment, and corresponds to the flowchart shown in FIG. 4. Like step numbers denote the same processes as the processes described in the flowchart shown in FIG. 4, and the detailed description thereof is omitted.

In the present embodiment, instead of the process of step S101 shown in FIG. 4, the process of step S116 shown in FIG. 8 is executed. In step S116, the controller 30 calculates the polarization elimination time ts on the basis of the SOC of the battery pack 10 and the battery temperature Tb. The SOC of the battery pack 10 is the SOC at the time when charging or discharging of the battery pack 10 is stopped in response to switching of the ignition switch into the off state. The SOC corresponds to the SOC_s described in the process of step S106. The battery temperature Tb is the battery temperature Tb at the time when charging or discharging of the battery pack 10 is stopped in response to switching of the ignition switch into the off state, and is detected by the temperature sensor 23.

When the SOC of the battery pack 10 is calculated, the polarization elimination time ts may be calculated by using the correlation between an SOC and a rate of change in electromotive voltage and the correlation between a rate of change in electromotive voltage and a polarization elimination time, as described above. In the process of step S116, the polarization elimination time ts is calculated in consideration of not only the SOC of the battery pack 10 but also the battery temperature Tb. However, it is possible to calculate the polarization elimination time ts from the SOC of the battery pack 10 without consideration of the battery temperature Tb. The thus calculated polarization elimination time ts is used in the process of step S104.

In the present embodiment, instead of the process of step S110 shown in FIG. 4, the process of step S117 shown in FIG. 8 is executed. In step S117, the controller 30 stops external charging as in the case of the first embodiment. The controller 30 calculates the polarization elimination time te on the basis of the SOC of the battery pack 10 and the battery temperature Tb. The SOC of the battery pack 10 is the SOC at the completion of external charging.

The SOC is obtained by adding the variation ΔSOC during the period when external charging to the SOC at the start of external charging. The SOC_s described in the process of step S105 or step S106 may be used as the SOC at the start of external charging. On the other hand, the variation ΔSOC may be calculated by dividing the accumulated current value ΣIb calculated in the process of step S108 by the full charge capacity FCC. The battery temperature Tb is the battery temperature Tb at the completion of external charging, and is detected by the temperature sensor 23.

When the SOC of the battery pack 10 is calculated, the polarization elimination time te may be calculated as described above. In the process of step S117, the polarization elimination time te is calculated in consideration of not only the SOC of the battery pack 10 but also the battery temperature Tb. However, the polarization elimination time te may be calculated from the SOC of the battery pack 10 without consideration of the battery temperature Tb. The thus calculated polarization elimination time te is used in the process of step S112.

One of the processes of step S116 and step S117 shown in FIG. 8 may be executed. When only the process of step S116 is executed, the process of step S110 shown in FIG. 4 may be executed instead of the process of step S117. Instead of the process of step S117, a predetermined time (fixed value) may be used as the polarization elimination time te.

When only the process of step S117 is executed, the process of step S101 shown in FIG. 4 may be executed instead of the process of step S116. Instead of the process of step S116, a predetermined time (fixed value) may be used as the polarization elimination time ts.

A third embodiment of the invention will be described. Like reference numerals denote the same components to those described in the first embodiment, and the detailed description thereof is omitted. Hereinafter, the difference from the first embodiment will be mainly described.

The rate of change in electromotive voltage is a value obtained by dividing the variation ΔOCV by the variation ΔSOC, and depends on the correlation (OCV curve) between an OCV and an SOC as described with reference to FIG. 2. Therefore, there is a correlation shown in FIG. 9 between a rate of change in electromotive voltage and an OCV. The correlation shown in FIG. 9 may be calculated on the basis of the OCV curve shown in FIG. 2. The gradient of a tangent to the OCV curve passing through the OCV (one point) of the OCV curve becomes the rate of change in electromotive voltage. Thus, the correlation shown in FIG. 9 is obtained.

In the first embodiment, the polarization elimination times ts, te are calculated from the rate of change in electromotive voltage; however, when the correlation shown in FIG. 9 is used, the polarization elimination times ts, te may be calculated from the OCV of the battery pack 10. When the OCV of the battery pack 10 is identified, the rate of change in electromotive voltage corresponding to the OCV may be identified by using the correlation shown in FIG. 9. When the rate of change in electromotive voltage is identified, the polarization elimination times ts, te may be identified by using the correlation shown in FIG. 3. As in the case of the first embodiment, when the polarization elimination times ts, te are calculated, the battery temperature Tb may be taken into consideration.

Figure 10:
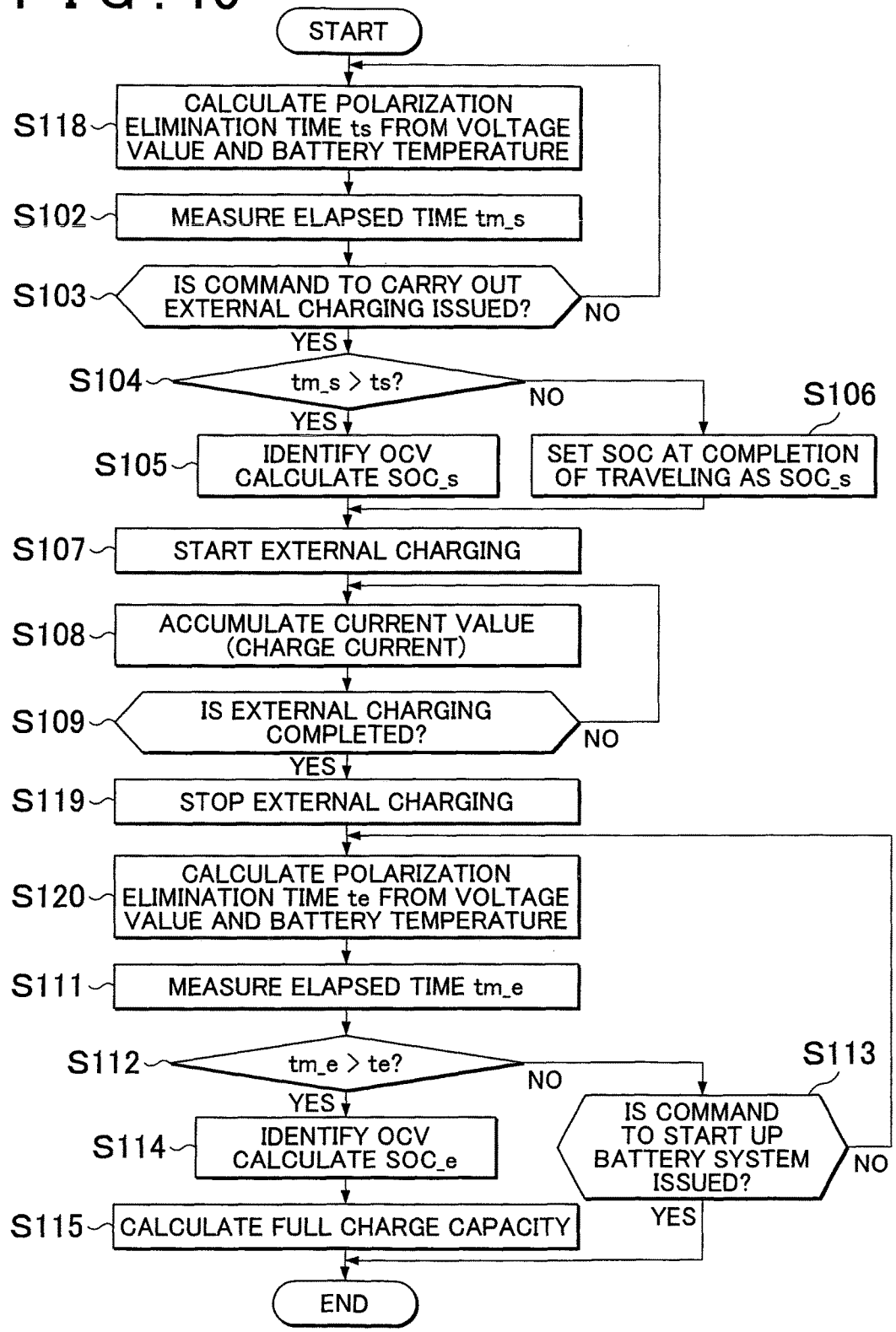
FIG. 10 is a flowchart that illustrates the process of calculating a full charge, capacity of a battery pack according to a third embodiment.

In the present embodiment, the polarization elimination times ts, te are calculated from the voltage value Vb of the battery pack 10 without calculating the rate of change in electromotive voltage. The flowchart shown in FIG. 10 shows the process of calculating the full charge capacity of the battery pack 10 in the present embodiment, and corresponds to the flowchart shown in FIG. 4. Like step numbers denote the same processes as the processes described in the flowchart shown in FIG. 4, and the detailed description thereof is omitted.

In the present embodiment, instead of the process of step S101 shown in FIG. 4, the process of step S118 shown in FIG. 10 is executed. In step S118, the controller 30 calculates the polarization elimination time ts on the basis of the voltage value Vb of the battery pack 10 and the battery temperature Tb. The voltage value Vb of the battery pack 10 is the voltage value Vb after charging or discharging of the battery pack 10 is stopped in response to switching of the ignition switch into the off state, and is detected by the voltage sensor 21. The voltage value Vb is regarded as the OCV of the battery pack 10. The battery temperature Tb is the battery temperature Tb after charging or discharging of the battery pack 10 is stopped in response to switching of the ignition switch into the off state, and is detected by the temperature sensor 23.

By regarding the voltage value Vb of the battery pack 10 as the OCV, the polarization elimination time ts may be calculated by using the correlation between an OCV and a rate of change in electromotive voltage and the correlation between a rate of change in electromotive voltage and a polarization elimination time, as described above. In the process of step S118, the polarization elimination time ts is calculated in consideration of not only the voltage value Vb (value regarded as the OCV) of the battery pack 10 but also the battery temperature Tb. However, the polarization elimination time ts may be calculated from the voltage value Vb of the battery pack 10 without consideration of the battery temperature Tb.

In the process of step S103, until it is, determined that a command to carry out external charging is issued, the processes of step S118 and step S102 are executed. When the process returns from the process of step S103 to the process of step S118, the polarization elimination time ts is calculated again on the basis of the voltage value Vb and the battery temperature Tb at this time. That is, until a command to carry out external charging is issued, detection of the voltage value Vb and the battery temperature Tb is repeated, and calculation of the polarization elimination time ts is repeated. The polarization elimination time ts that is used in the process of step S104 is the polarization elimination time ts that is calculated from the voltage value Vb and the battery temperature Tb at the time when a command to carry out external charging is issued.

As a time from when the ignition switch is switched into the off state extends, polarization that has occurred as a result of charging or discharging of the battery pack 10 before the ignition switch is switched into the off state becomes easy to be eliminated. Accordingly, the voltage value Vb changes and approaches the OCV. Thus, when the process returns from the process of step S103 to the process of step S118, the voltage value Vb has changed, and the polarization elimination time ts is calculated on the basis of the changed voltage value Vb.

When the process returns from the process of step S103 to the process of step S118, the battery temperature Tb may change. In this case, the polarization elimination time ts is calculated on the basis of the changed battery temperature Tb.

As described above, in calculating the polarization elimination time ts, the voltage value Vb is regarded as the OCV. As the voltage value Vb approaches the OCV, it is possible to acquire a more accurate rate of change in electromotive voltage, and it is possible to calculate a more accurate polarization elimination time ts. The thus calculated polarization elimination time ts is compared with the elapsed time tm_s. When the elapsed time tm_s is longer than the polarization elimination time ts, the process of step S105 may be executed. In the process of step S105, the SOC_s included in the allowable range ΔSOC_err described in FIG. 2 is easy to be calculated. Accordingly, the estimation accuracy of the full charge capacity FCC that is calculated from the SOC_s is easy to be ensured.

In the present embodiment, instead of the process of step S110 shown in FIG. 4, the processes of step S119 and step S120 shown in FIG. 10 are executed. In step S119, the controller 30 stops external charging as in the case of the first embodiment. In step S120, the controller 30 calculates the polarization elimination time to on the basis of the voltage value Vb of the battery pack 10 and the battery temperature Tb. The voltage value Vb of the battery pack 10 is the voltage value Vb after external charging is stopped, and is detected by the voltage sensor 21. The voltage value Vb is regarded as the OCV of the battery pack 10. The battery temperature Tb is the battery temperature Tb after external charging is stopped, and is detected by the temperature sensor 23.

By regarding the voltage value Vb of the battery pack 10 as the OCV, the polarization elimination time te may be calculated by using the correlation between an OCV and a rate of change in electromotive voltage and the correlation between a rate of change in electromotive voltage and a polarization elimination time, as described above. In the process of step S120, the polarization elimination time te is calculated in consideration of not only the voltage value Vb (value regarded as the OCV) of the battery pack 10 but also the battery temperature Tb. However, the polarization elimination time te may be calculated from the voltage value Vb of the battery pack 10 without consideration of the battery temperature Tb.

In the process of step S113, when no command to start up the battery system is issued, the process of step S120 is executed. When the process returns from the process of step S113 to the process of step S120, the polarization elimination time te is calculated again on the basis of the voltage value Vb and the battery temperature Tb at this time. That is, while no command to start up the battery system is issued, detection of the voltage value Vb and the battery temperature Tb is repeated, and calculation of the polarization elimination time te is repeated. The thus calculated polarization elimination time te is used in the process of step S112. That is, in the process of step S112, the latest calculated polarization elimination time te is used.

As a time from when external charging is stopped extends, polarization that has occurred as a result of external charging becomes easy to be eliminated. Accordingly, the voltage value Vb changes and approaches the OCV. Thus, when the process returns from the process of step S113 to the process of step S120, the voltage value Vb has changed, and the polarization elimination time te is calculated on the basis of the changed voltage value Vb.

When the process returns from the process of step S113 to the process of step S120, the battery temperature Tb may change. In this case, the polarization elimination time te is calculated on the basis of the changed battery temperature Tb.

As described above, in calculating the polarization elimination time te, the voltage value Vb is regarded as the OCV. As the voltage value Vb approaches the OCV, it is possible to acquire a more accurate rate of change in electromotive voltage, and it is possible to calculate a more accurate polarization elimination time te. The thus calculated polarization elimination time te is compared with the elapsed time tm_e. When the elapsed time tm_e is longer than the polarization elimination time te, the process of step S114 may be executed. In the process of step S114, the SOC_e included in the allowable range ΔSOC_err described in FIG. 2 is easy to be calculated. Accordingly, the estimation accuracy of the full charge capacity FCC that is calculated from the SOC_e is easy to be ensured.

In the present embodiment, the process returns from the process of step S103 to the process of step S118; however, the process is not limited to this configuration. Specifically, when no command to carry out external charging is issued, the process may return from the process of step S103 to the process of step. S102. In this case, when the process shown in FIG. 10 is started, the process of step S118 is executed only once.

In the present embodiment, the process returns from the process of step S113 to the process of step S120; however, the process is not limited to this configuration. Specifically, when no command to start up the battery system is issued, the process may return from the process of step S113 to the process of step S111. In this case, the process of step S120 is executed only once.

The invention claimed is:
1. An electrical storage system comprising:
an electrical storage device configured to be charged by an external charging, the external charging being to carry out charging with electric power from an external power supply;
a voltage sensor configured to detect a voltage value of the electrical storage device;
a current sensor configured to detect a current value of the electrical storage device; and
a controller configured to
(a) calculate a full charge capacity of the electrical storage device based on a state of charge of the electrical storage device at the time when the external charging is started, a state of charge of the electrical storage device at the time when the external charging is completed, and an accumulated value of the current value during the period when the external charging is being carried out,
(b) set a polarization elimination time, the polarization elimination time being used to determine an eliminated state of polarization that occurs as a result of charging or discharging of the electrical storage device,
(c) regard a voltage value of the electrical storage device at the time of at least one of the start of the external charging or the completion of the external charging as an open circuit voltage of the electrical storage device, the voltage value being detected by the voltage sensor, when a stopped time during the period when charging or discharging of the electrical storage device is stopped is longer than the polarization elimination time, (d) calculate the state of charge corresponding to the voltage value detected by the voltage sensor as the state of charge that is used to calculate the full charge capacity by using a correlation between the open circuit voltage and the state of charge, and (e) shorten the polarization elimination time as a rate of change increases, the rate of change indicating a ratio of a variation in the open circuit voltage to a variation in the state of charge.

2. The electrical storage system according to claim 1, wherein
the controller is configured to, when charging or discharging of the electrical storage device is stopped, calculate the variation in the state of charge and the variation in the open circuit voltage based on the state of charge and the open circuit voltage in a period until the charging or discharging is stopped and also calculate the rate of change, and calculate the polarization elimination time corresponding to the calculated rate of change by using a correlation between the rate of change and the polarization elimination time.

3. The electrical storage system according to claim 1, wherein
the controller is configured to calculate the state of charge at the time when charging or discharging of the electrical storage device is stopped, and calculate the polarization elimination time corresponding to the calculated state of charge by using a correlation between the rate of change and the polarization elimination time and a correlation between the rate of change and the state of charge.

4. The electrical storage system according to claim 1, wherein
the controller is configured to, while charging or discharging of the electrical storage device is stopped, calculate the polarization elimination time corresponding to the voltage value detected by the voltage sensor by using a correlation between the rate of change and the polarization elimination time and a correlation between the rate of change and the voltage value.

5. The electrical storage system according to claim 4, wherein
the controller is configured to, while charging or discharging of the electrical storage device is stopped, repeat detection of the voltage value by the voltage sensor, and calculate the polarization elimination time corresponding to the detected voltage value each time the voltage value is detected.

6. The electrical storage system according to claim 1, further comprising:
a temperature sensor configured to detect a temperature of the electrical storage device, wherein
the controller is configured to shorten the polarization elimination time as the temperature increases.

7. An electrical storage system for a vehicle, the electrical storage system comprising:
an electrical storage device configured to be charged with electric power from an external power supply, the external power supply being installed outside the electrical storage device separately from the electrical storage device;
a voltage sensor configured to detect a voltage value of the electrical storage device; and
a controller configured to
calculate a rate of change in electromotive voltage at at least one of first timing or second timing,
calculate a predetermined standby time based on the rate of change in electromotive voltage,
calculate a state of charge of the electrical storage device, when the predetermined standby time has elapsed from the first timing or the second timing,
calculate a full charge capacity of the electrical storage device by using the state of charge, and
shorten the predetermined standby time as the rate of change in electromotive voltage increases,
the first timing being predetermined timing in a period from when an ignition switch of the vehicle is switched into an off state to when charging of the electrical storage device with electric power from the external power supply is started,
the second timing being predetermined timing during the period when the vehicle is left standing after charging of the electrical storage device with electric power from the external power supply is completed,
the rate of change in electromotive voltage being a ratio of a variation in open circuit voltage to a variation in state of charge of the electrical storage device.

* * * * *